United States Patent [19]

Markus

[11] Patent Number: 5,103,162

[45] Date of Patent: Apr. 7, 1992

[54] APPARATUS FOR DETERMINING WHEN A PRESELECTED PHASE RELATIONSHIP EXISTS BETWEEN TWO PERIODIC WAVEFORMS

[75] Inventor: David R. Markus, Monroeville, Pa.

[73] Assignee: Westinghouse Electric Corp., Pittsburgh, Pa.

[21] Appl. No.: 672,978

[22] Filed: Mar. 21, 1991

[51] Int. Cl.[5] ............................................. G01R 25/00
[52] U.S. Cl. .................................. 324/83 D; 324/86; 324/83 R; 328/134
[58] Field of Search ........................ 328/133, 134, 155; 307/510, 511, 514, 516; 324/83 A, 83 D, 83 Q, 83 R, 79 D, 86, 108

[56] References Cited

U.S. PATENT DOCUMENTS

| 3,515,997 | 6/1970 | Babany ................................. 328/134 |
| 3,564,286 | 2/1971 | Rubner et al. . |
| 3,621,278 | 11/1971 | Rubner et al. . |
| 3,652,933 | 3/1972 | Rubner et al. . |
| 4,119,910 | 10/1978 | Hayashi ................................. 328/134 |
| 4,471,299 | 9/1984 | Elmis ................................. 324/83 D |
| 4,527,080 | 7/1985 | Zweig . |
| 4,559,492 | 12/1985 | Baba ................................. 324/83 D |
| 4,600,994 | 7/1986 | Hayashi . |
| 4,884,020 | 11/1989 | Blakeslee ................................. 324/83 D |
| 4,926,115 | 5/1990 | Tarleton ................................. 324/83 D |

Primary Examiner—Kenneth A. Wieder
Assistant Examiner—Jose M. Solis
Attorney, Agent, or Firm—M. J. Moran

[57] ABSTRACT

Apparatus for determining when two periodic signals are within preselected limits of being in phase, includes square wave generators which convert the periodic signals to pulse trains, and an AND gate which combines the pulse trains to generate a rectangular wave signal having a logic one value when the two pulse trains overlap. A monostable one-shot multivibrator generates clock pulses in response to the leading edge of the rectangular wave signal. A flip-flop latches its output to the logic level of the rectangular wave signal on the trailing edge of the clock pulses. The clock pulses are of a duration representative of the selected phase angle limit, so that the output of the flip-flop is a phase angle acceptance window having a logic 1 value when the difference in phase between the periodic signals is within the selected limits.

11 Claims, 3 Drawing Sheets

APPARATUS FOR DETERMINING WHEN A PRESELECTED PHASE RELATIONSHIP EXISTS BETWEEN TWO PERIODIC WAVEFORMS

BACKGROUND OF THE INVENTION

1. Field of the Invention

This invention relates to apparatus for determining when two periodic waveforms are within a predetermined phase angle of being in phase.

2. Background Information

In certain applications, it is necessary or desirable to determine the phase angle between periodic waveforms. The detection and discrimination of the angle of phased displacement between two sinusoidal waveforms is used frequently in the design of automatic synchronization apparatus for electric power generation systems. In such synchronization apparatus, the two sinusoidal waveforms typically represent the voltages of a generator and of an electric grid to which the generator is to be connected. In particular, the concept of phase angle discrimination is used in a device generally referred to as a "synchro acceptor". The function of such a device is to describe a "window" of phase displacement in which synchronization is permitted. Such a device is typically used together with an automatic synchronizer, or a manual synchronization system, to restrict the maximum possible phase displacement at the time of closing the circuit breaker connecting the generator to the grid. In the event of a failure of the automatic apparatus, or a careless attempt to synchronize manual means, this acceptance window will limit the out-of-phase condition that can exist at the time of closure.

A typical synchro acceptor currently available is disclosed in U.S. Pat. No. 3,652,933. In this apparatus, the two incoming sinusoids are converted to square waves, and an exclusive NOR function is applied to the trains of square waves. This function produces a train of pulses of varying widths, where the width of the pulse is related to the instantaneous phase displacement. This pulse train is then filtered using conventional low-pass filtering techniques to produce a triangular waveform. The amplitude of this triangular waveform at any given time is proportional to the phase displacement of the two sinusoids. The frequency of the triangular waveform is equal to the difference between the grid and generator frequencies, and is called the "slip" frequency. The triangular waveform is input to an amplitude detector (comparator) circuit. By adjusting a trigger level of the comparator, the output of the comparator can be enabled only for amplitudes greater than the trigger level. Hence, this circuit can be made to enable synchronization only for a certain range of phase displacements. This range is usually called the "window".

It is well known that the process of low-pass filtering utilizing RC (resistor-capacitor) networks introduces phase delays and attenuates amplitude as the frequency of the input waveform increases. The process of low-pass filtering as employed by the synchro acceptor of U.S. Pat. No. 3,652,933 will be penalized by the same phase delays and variations in amplitude with frequency. Since the window is determined by the level detecting comparator, any variations in amplitude attributable to frequency will distort the resulting window.

Other filtering techniques such as LC (inductor-compacitor) networks require use of large and bulky inductors since the frequency range of interest is restricted to the common power line frequencies of 50 Hz and 60 Hz. These networks, like the RC networks, contain a component in their response which is dependent on the frequencies present in the incoming waveforms.

There remains a need therefore for apparatus for determining when two periodic waveforms are within a predetermined phase angle of being in phase which is not frequency dependent and which does not require large bulky components.

SUMMARY OF THE INVENTION

It is the primary object of the invention to provide an improved apparatus for determining phase angle between two periodic waveforms.

More specifically, it is an object of the invention to provide such an improved apparatus in which the determination of the phase relationship is not dependent upon the frequencies of the waveforms.

It is a more particular object of the invention to provide such an improved apparatus which does not require low pass filtering.

It is an additional object of the invention to provide such an improved apparatus which does not require large physical components.

These and other objects are realized by the invention which is directed to apparatus which includes a circuit which generates a rectangular wave signal having a first level when the two periodic waveforms are each of a same first polarity and having a second level otherwise. The apparatus includes second circuit means generating a pulse signal in response to the leading edge of this rectangular wave signal. A third circuit responsive to the trailing edge of the pulse signal and the level of the rectangular wave signal latches an output signal to a first level when the rectangular wave signal is at the first level at the trailing edge of the pulse signal and latches the output signal to a second level when the square wave signal is at the second level at the trailing edge of the pulse signal. The pulse signal is of a duration selected to represent a preselected phase difference between the two periodic waveforms. The pulse signal is initiated at the instant when the polarities of the two periodic waveforms become the same. If the periodic waveforms are still of the same polarity at the end of the pulse signal, then the phase angle between the two periodic waveforms is less than the preselected phase angle.

The invention has application to a synchro acceptor used in synchronization apparatus for electric power systems where the frequencies of the grid voltage and a generator voltage can be slightly different. In this case, the invention is used to generate a window during which the phase difference is within limits which are acceptable for switching the generator into the grid. The invention also has application to determining when the phase angle between periodic waveforms of the same frequency are within preselected limits.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention will be described as applied to a synchro acceptor for determining when the ac voltage generated by a generator is within the preselected number of degrees of being in phase with the power on an electric grid. The invention generates a window during which the difference in phase between the generator and the grid voltages is within acceptable limits for connecting the generator to the grid.

Figure 1:
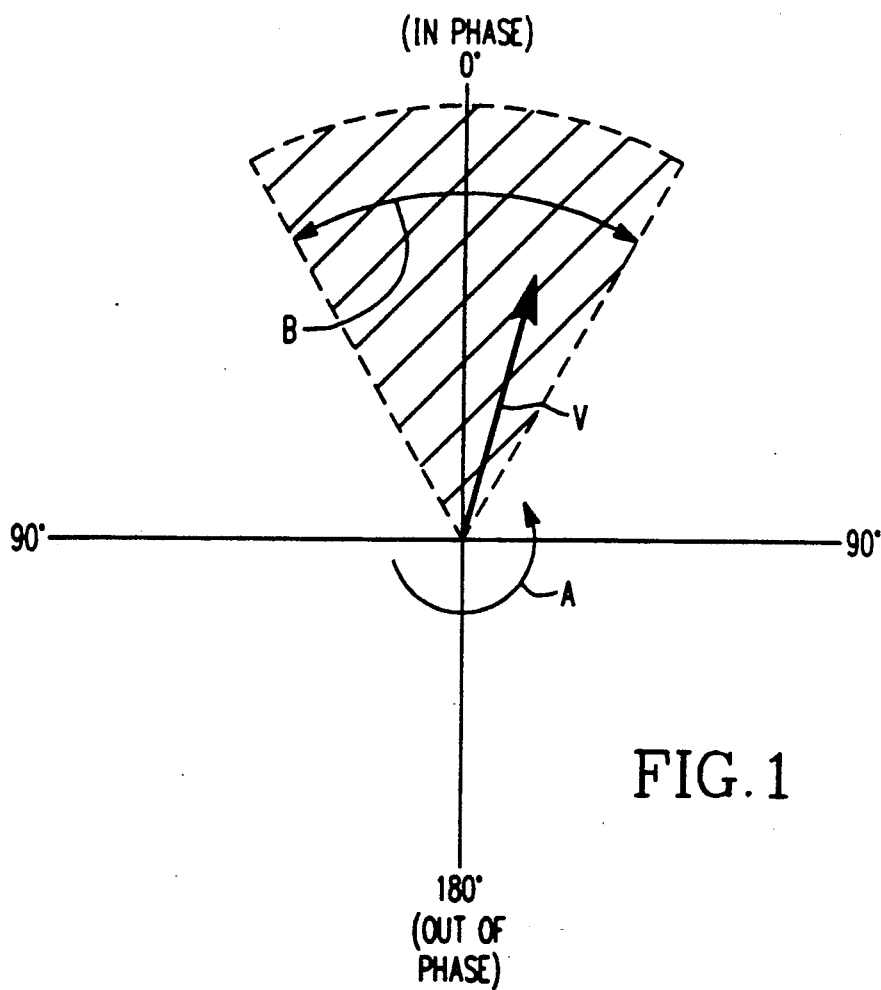
FIG. 1 is a diagram illustrating the concept of the generation of a phase angle window in accordance with the invention.

Typically, the grid and the ac generator waveforms can have slightly different frequencies. This difference in frequency is represented by the instantaneous phase displacement vector V illustrated in FIG. 1. This instantaneous phase displacement vector rotates in the direction of the arrow A illustrating that the phase displacement is constantly changing. The apparatus of the invention establishes an acceptable window, angle B in FIG. 1. When the instantaneous phase displacement vector 1 is within this acceptable window angle B, the generator can be connected to the grid.

Figure 2:
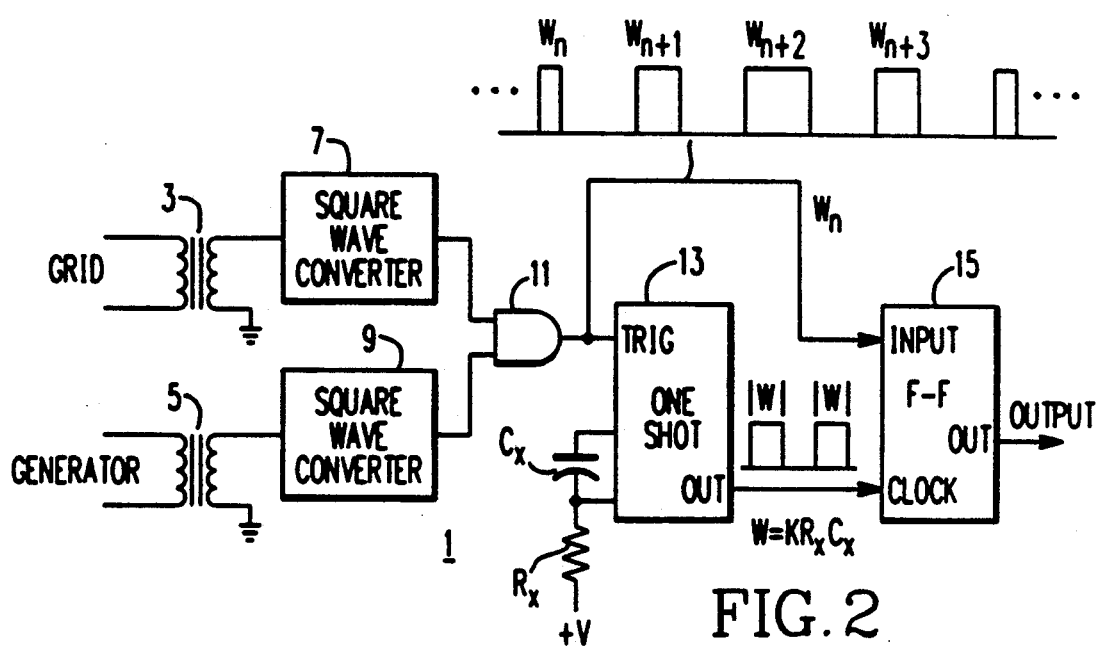
FIG. 2 is a schematic diagram in block form of apparatus in accordance with the invention.

FIG. 2 schematically illustrates apparatus for generating the acceptable phase angle window in accordance with the invention. In this phase angle detector 1, ac signals representative of the grid and generator voltages generated by the transformers 3 and 5 are converted into square wave signals by the square wave converters 7 and 9, respectively. Square wave converters 7 and 9 convert the sinusoidal waveforms into pulse trains. An AND function 11 generates a rectangular wave signal having a logic one level when the pulses of the two square wave pulse trains overlap. That is the AND function 11 generates a logic one output when the grid voltage and generator voltage are of the same one polarity and is at a zero logic level otherwise. The rectangular waveform generated by the AND function 11 is applied to the trigger input of a monostable one-shot multivibrator 13 which generates in response to the leading edge of the rectangular wave signal, a clock pulse having a duration determined by a capacitor $C_x$ and resistor $R_x$ connected to inputs of the monostable one-shot multivibrator 13.

The rectangular wave signal, which is a combination of the square wave signals representing the grid and generator voltages, is also applied to the input of a flip-flop 15. The clocking pulses generated by the monostable one-shot multivibrator 13 are applied to the clock input of the flip-flop 15. The output of the flip-flop 15 is latched to the value of the rectangular wave applied to the input at the trailing edge of the clock pulses applied to the clock input of the flip-flop. This output, or window signal, generated by the flip-flop 15 has a logic 1 level when the rectangular wave signal has a duration longer than the clock pulses generated by the monostable one-shot multivibrator 13. The closer that the generator and grid voltages are to being in phase, the longer is the duration of the rectangular wave applied to the input of the flip-flop 15. So long as this interval exceeds the duration of the timing pulses generated by the monostable one-shot multivibrator 13, the window generated by the flip-flop remains "open".

Figure 3:
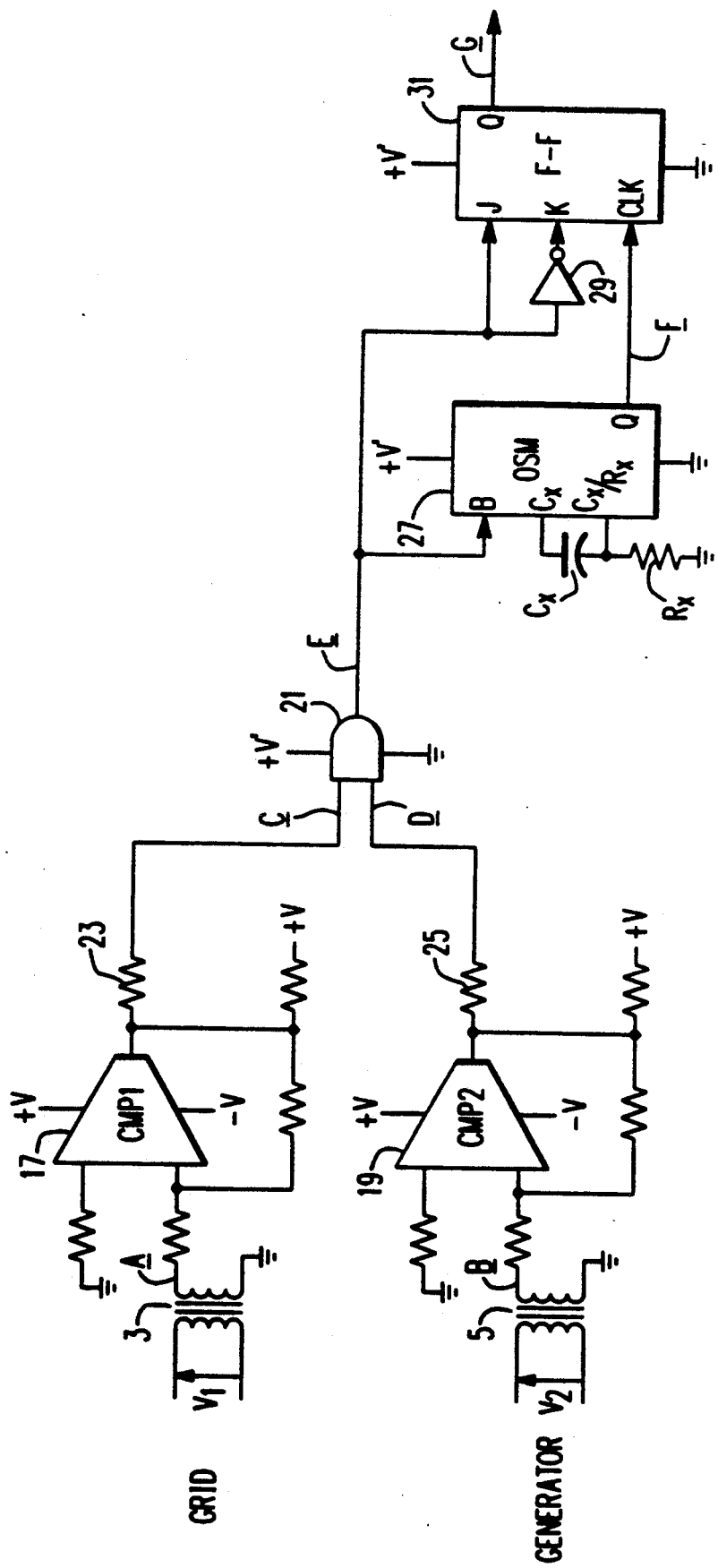
FIG. 3 is a schematic diagram of a particular implementation of the apparatus illustrated in FIG. 2.
Figure 4:
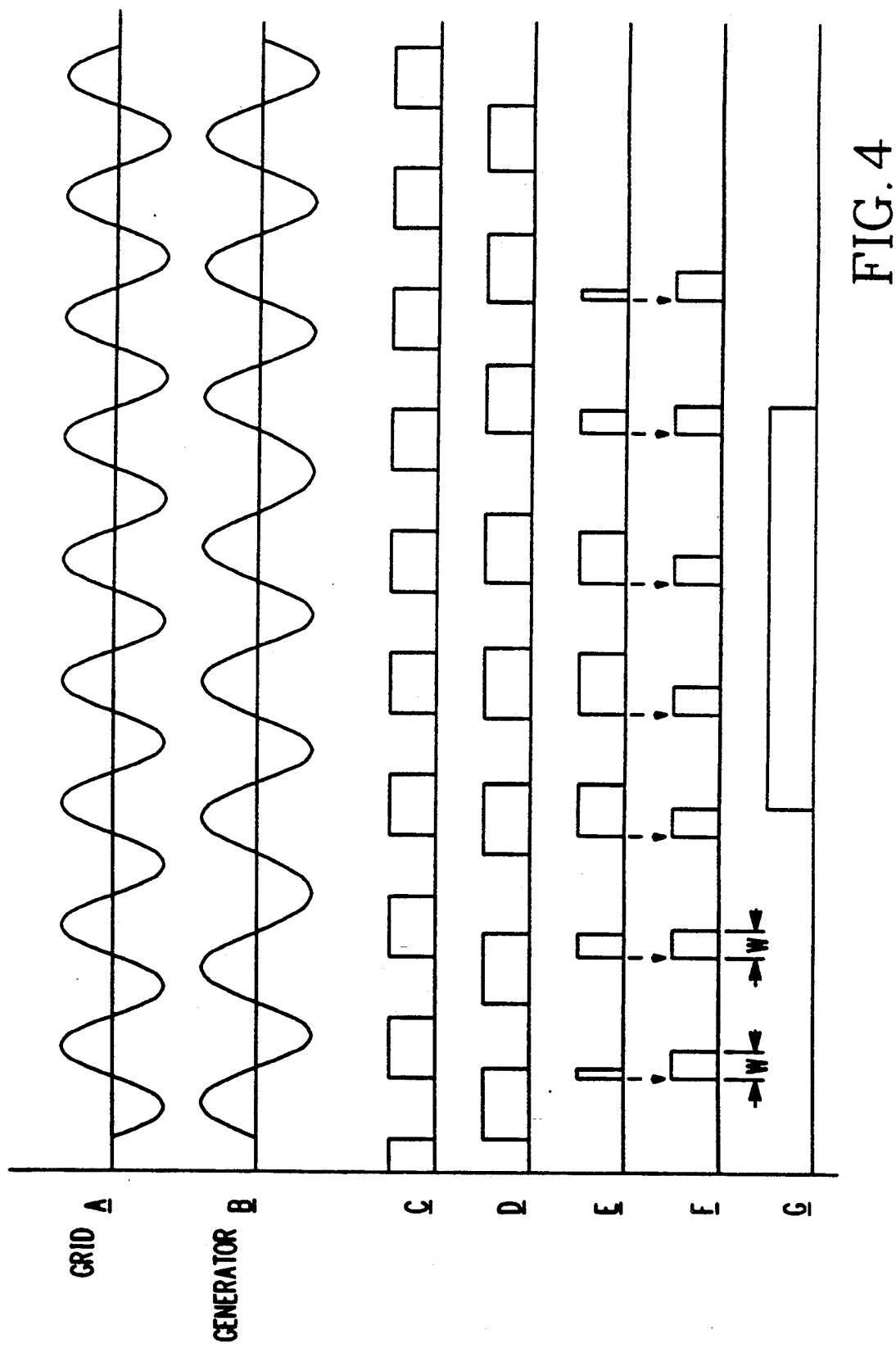
FIG. 4 is a timing diagram depicting several signals present at various locations in the implementation of the invention illustrated in FIG. 3.

FIG. 3 illustrates a particular implementation of the invention. Waveforms generated at locations to be identified in the circuit shown in FIG. 3 are illustrated in the timing diagram of FIG. 4. The transformers 3 and 5 generate the sinusoidal waveforms A and B which are representations of the grid voltage $V_1$ and the generator voltage $V_2$, respectively. The sinusoidal waveforms A and B illustrated by the traces A and B of FIG. 4 are converted to square waves by comparators 17 and 19, respectively. The positive half-cycle of the incoming sinusoidal waveform A and B create a positive voltage at the output of the respective comparators, and the negative half-cycles create a negative comparator output voltage. The two pulse trains generated by the comparators 17 and 19 are applied to the AND gate 21 to produce a modulated pulse train. The AND gate 21 is a CMOS gate. Clamping diodes on the inputs to the AND gate 21 limit the negative excursion of the pulse trains applied to the AND gate to just slightly below zero volts. Thus, the pulse trains C and D have a positive value when the sinusoids A and B are positive, and have a zero logic level when the input sinusoids are negative. Resistors 23 and 25 limit the input current to the AND gate 21. The combined pulse signal which is the output of the AND gate 21 is illustrated as signal E in FIG. 4.

The rectangular waveform E which is a combination of the pulse trains representing positive polarity of the two input sinusoids is applied to the B input of the monostable one-shot multivibrator 27. The monostable one-shot multivibrator 27 is triggered by the leading edge of the rectangular wave signal E to generate a pulse signal F at its Q output. The duration of the pulses in the signal F are determined by the values of the capacitor $C_x$ and the resistor $R_x$ connected to the correspondingly identified inputs to the monostable one-shot multivibrator 27.

The rectangular waveform E is also applied to the J input, and through an inverter 29 to the K input, of a J-K flip-flop 31. The J-K flip-flop 31 is clocked by the pulse signal F applied to a clock input CLK to generate an output signal G at a Q output. The Q output of the flip-flop 31 is latched to the value of the signal applied to the J input at the trailing edge of the clock pulses. Thus, the Q output of flip-flop 31 is latched to a high level if the signal E applied to the J input is high at the termination of the clock pulse F, and is latched to a low level if the signal E is at a low level on the trailing edge of the clock pulse.

The operation of the circuit of FIG. 3 can be better understood by reference to the waveforms of FIG. 4. A and B are the input reference waveforms which represent the grid and generator voltages respectively. In the example, these two sinusoidal signals are of slightly different frequencies so that the phase difference between them is constantly changing. The traces C and D in FIG. 4 are the squared grid and generator voltages generated by the comparators 17 and 19, respectively. The pulses of these signals represent the positive half cycles of the respective sinusoidal voltages. Trace E illustrates the rectangular wave which is the combination of the two pulse signals C and D produced by the AND circuit 21. For large phase differences between the sinusoidal signals, the duration of the pulses of the rectangular waveform E is very short. As the phase difference decreases, the duration of the E signal pulses increases to a maximum and then decreases again as the difference in phase between the sinusoidal signals increases again.

The clocking pulses generated by the monostable one-shot multivibrator 27 are triggered by the leading edges of the pulses of the combined pulse signal E. As can be seen, the duration of the clocking pulses F remains constant. For large phase angle displacement between the sinusoidal signals, the pulses of the rectangular waveform E are shorter in duration than the fixed duration clocking pulses F. Thus, the input to the J-K flip-flop 31 at the trailing edge of the clock pulses F is low for the first two clocking pulses shown in FIG. 4, and hence, the output signal G remains low. As can be seen though, by the third pulse of the signal E, as illustrated in FIG. 4, the pulse E is greater in width than the pulse F, and hence, the output signal G goes high representing an opening of the acceptance window. As long as the duration of the pulses E exceeds the duration of the pulses F, the window remains open. However, when, as shown by the sixth pulse E in FIG. 4, the phase difference between the sinusoidal signals has increased to the point where the pulse E is shorter in duration than the clocking pulse F, the input to the J-K flip-flop 31 is low at the trailing edge of the clock pulse F and the signal G goes low representing a closing of the acceptance window. This acceptance window will open and close as the sinusoidal input signals of slightly different frequency drift into and out of phase.

The apparatus of the invention has certain frequency limitations. For generator frequencies that are an even integer multiple (or an even integer fraction) of the grid frequency, there will be no apparent slip frequency. Hence, there will be no modulated pulse train, and it will appear that the two sinusoids are at the same frequency, but at some constant phase displacement. In the art of synchronizing, such a large frequency difference would be sensed by other auxiliary circuits and disable the phase angle acceptance process Synchronizing equipment is normally frequency limited to respond only to generator frequencies falling within the grid frequency, plus/minus 10%. On a 60 Hz nominal grid, the valid generator frequency band would be from 54 Hz to 66 Hz. The apparatus disclosed herein will function adequately within these limits Importantly, the apparatus of the invention does not require filter networks or other large physical components within the limits discussed above is not frequency dependent.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Apparatus for determining a phase difference between first and second periodic waveforms comprising:
   first circuit means generating a rectangular wave signal having a first level when said first and second periodic waveforms are each of a same first polarity, and having a second level otherwise, said rectangular wave signal having a leading edge transitioning from said second level to said first level and a trailing edge transitioning from said first level to said second level;
   second circuit means generating a pulse signal of a predetermined duration in response to the leading edge of said rectangular wave signal, said pulse signal having a leading edge and a trailing edge; and
   third circuit means responsive to the trailing edge of said pulse signal and the level of said rectangular wave signal and operative to latch an output signal to a first level when said rectangular wave signal is at said first level at the trailing edge of said pulse signal, and to latch the output signal to a second level when said rectangular wave signal is at said second level at said trailing edge of said pulse signal, said predetermined duration of said pulse signal being selected to represent a preselected phase difference between said first and second periodic waveforms, whereby said output signal has said first level when the phase difference between said first and second periodic waveforms is less than said preselected phase difference.

2. The apparatus of claim 1 wherein said first circuit means comprises first square wave generating means generating a square wave signal from said first periodic waveform, second square wave generating means generating a second square wave signal from said second periodic waveform, and additional circuit means combining said first and second square wave signals to generate said rectangular wave signal.

3. The apparatus of claim 2 wherein said second circuit means comprises a monostable one-shot multivibrator having said rectangular waveform applied to an input and generating said clock pulse in response to the leading edge of said rectangular wave signal, and timing means setting the duration of said clock pulse to said predetermined duration.

4. The apparatus of claim 3 wherein said third circuit means comprises a J-K flip-flop having a clock input to which said clock pulse is applied and a J input and a K input, an inverter connected to said K input, and means connecting said rectangular wave signal to said J input and of said inverter, said J-K flip-flop generating at an output said output signal having a level corresponding to the level to said rectangular wave signal at the trailing edge of said clock pulse.

5. The apparatus of claim 1 wherein said second circuit means comprises a monostable one-shot multivibrator having said rectangular wave signal applied to an input and generating said clock pulse at an output in response to the leading edge of said rectangular wave signal, and timing means setting the duration of said clock pulse to said predetermined duration.

6. The apparatus of claim 1 wherein said third circuit means is a flip-flop having input means to which said rectangular wave signal is applied, a clock input to which said which clock pulses are applied, and an output generating said output signal having a level corresponding to the level of said rectangular wave signal at the trailing edge of said clock pulse.

7. The apparatus of claim 1 wherein said third circuit means comprises a J-K flip-flop having a clock input to which said pulse signal is applied, and having J input and a K input, and inverter connected to said K input, and means connecting said rectangular waveform to said J input and to said inverter, said J-K flip-flop having an output generating said output signal which has a level corresponding to the level of said rectangular waveform at the trailing edge of said clock pulse.

8. Apparatus for determining when a grid voltage of one frequency and phase and a generator voltage of another frequency and phase in an ac power system are within a preselected phase angle of being in phase, said apparatus comprising:

first square wave generating means generating a first square wave signal having a phase and a frequency corresponding to the phase and frequency of said grid voltage;

second square wave generating means generating a second square wave signal having a phase and a frequency corresponding to the phase and frequency of the generator voltage;

means combining said first and second square wave signals to generate a rectangular wave signal having a first level when said first and second square wave signals have a selected common polarity and a second level otherwise, said rectangular wave signal having a leading edge transitioning from said second level to said first level and a trailing edge transitioning from said first level to said second level;

means generating a clock pulse of a predetermined duration in response to the leading edge of said rectangular wave signal, said clock pulse signal having a leading edge and a trailing edge; and means responsive to the trailing edge of said clock pulse and to the level of said rectangular wave signal and operative to set an output signal to a first level when said rectangular wave signal is at said first level at the trailing edge of said clock pulse and to set the output signal to a second level when said rectangular wave signal is at said second level at said trailing edge of said clock pulse, said predetermined duration of said clock pulse being selected to represent said preselected phase angle, whereby said output signal has said first level when said grid voltage and generator voltage are within said preselected phase angle of being in phase.

9. The apparatus of claim 8 wherein said means generating a clock pulse comprises a monostable one-shot multivibrator having said rectangular waveform applied to an input and generating said clock pulse at an output in response to the leading edge of said rectangular signal, and timing means establishing said predetermined duration of said clock pulse.

10. The apparatus of claim 9 wherein said output signal generating means comprises a J-K flip-flop having a clock input to which said clock pulse is applied and having a J input and a K input, and an inverter connected to said K input, and means applying said rectangular waveform to said J input and to said inverter.

11. The apparatus of claim 8 wherein said output signal generating means comprises a J-K flip-flop having a clock input to which said clock signal is applied, and having a J input and a K input, and an inverter connected to said K input, and means applying said rectangular waveform to said J input and to said inverter.

* * * * *